United States Patent
Chang et al.

(10) Patent No.: US 8,831,550 B2
(45) Date of Patent: Sep. 9, 2014

(54) METHOD OF COMPENSATING SIGNAL IMBALANCE OF WIRELESS COMMUNICATION SYSTEM

(71) Applicant: Realtek Semiconductor Corp., HsinChu (TW)

(72) Inventors: Yuan-Shuo Chang, Taoyuan County (TW); Wen-Shan Wang, Tainan (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 13/937,198

(22) Filed: Jul. 8, 2013

(65) Prior Publication Data

US 2014/0018029 A1 Jan. 16, 2014

(30) Foreign Application Priority Data

Jul. 11, 2012 (TW) .................................. 101124974

(51) Int. Cl.
*H04B 1/10* (2006.01)
*H04B 17/00* (2006.01)

(52) U.S. Cl.
USPC .... 455/307; 455/63.1; 455/67.13; 455/67.14; 455/114.2; 375/296; 375/350

(58) Field of Classification Search
USPC ............ 455/63.1, 67.13, 67.14, 114.1, 114.2, 455/295, 296, 307, 339; 375/296, 346, 350
See application file for complete search history.

(56) References Cited

U.S. PATENT DOCUMENTS

| | | | |
|---|---|---|---|
| 6,798,844 B2 * | 9/2004 | Ratto | 375/296 |
| 7,092,454 B2 * | 8/2006 | Dinur | 375/296 |
| 7,184,714 B1 * | 2/2007 | Kutagulla et al. | 455/67.16 |
| 7,609,772 B2 * | 10/2009 | Yu et al. | 375/260 |
| 7,830,954 B2 * | 11/2010 | Welz et al. | 455/67.14 |
| 8,000,382 B2 | 8/2011 | Inanoglu | |
| 8,503,545 B2 * | 8/2013 | Li et al. | 375/346 |
| 2010/0329397 A1 | 12/2010 | Kim | |
| 2011/0222638 A1 | 9/2011 | Park | |

* cited by examiner

*Primary Examiner* — Quochien B Vuong
(74) *Attorney, Agent, or Firm* — Winston Hsu; Scott Margo

(57) ABSTRACT

Filter coefficients are generated by testing a wireless communication system using single-tone signals. While using the filter coefficients in a filter module, signal imbalance caused by a local oscillator or analog elements in a wireless communication system can be eliminated, so as to prevent the wireless communication system from being affected by the noises.

9 Claims, 9 Drawing Sheets

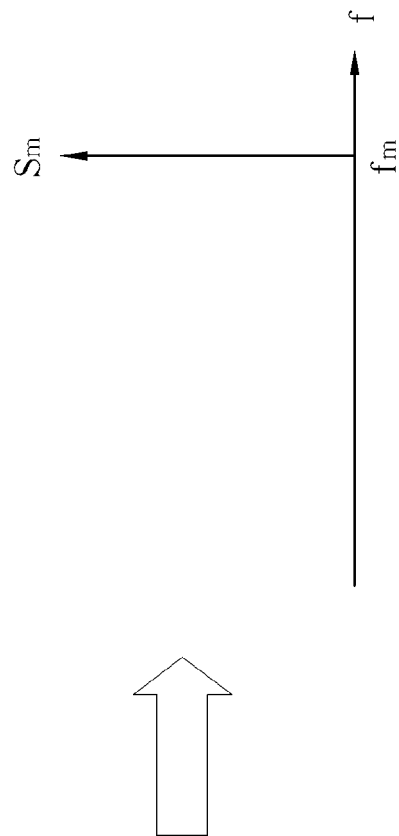
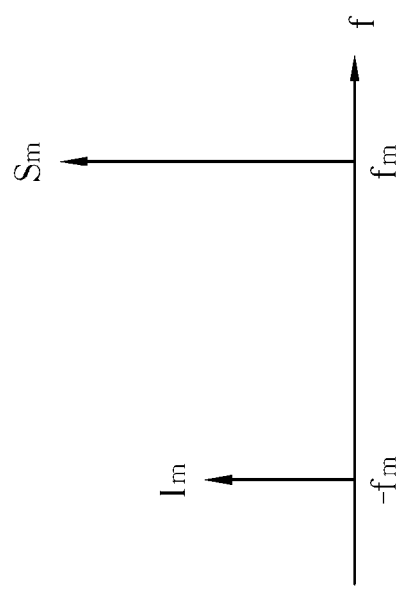
FIG. 6

METHOD OF COMPENSATING SIGNAL IMBALANCE OF WIRELESS COMMUNICATION SYSTEM

BACKGROUND OF THE INVENTION

1. Field of the Invention

The present invention discloses a method of compensating signal imbalance of a wireless communication system, and more particularly, a method of reducing signal imbalance called I/Q imbalance occurring in a wireless communication system by generating a set of filter coefficients utilized by the wireless communication system and by generating compensation signals using the set of filter coefficients to process wireless signals.

2. Description of the Prior Art

Please refer to FIG. 1 and FIG. 2, which illustrate a transmitter 110 and a receiver 120 of a conventional communication system. The transmitter 110 includes digital-to-analog converters 112 and 132, low-pass filters 114 and 134, mixers 116 and 136, a local oscillator 117, an adder 138, a power amplifier 119, and an antenna 118. The receiver 120 includes an antenna 128, a low noise amplifier 149, mixers 122 and 142, a local oscillator 127, low-pass filters 124 and 144, gain controllers 126 and 146, and analog-to-digital converters 129 and 148. The antenna 128 is configured to receive signals transmitted from the antenna 118. The digital-to-analog converters 112 and 132 respectively receive an in-phase portion I of a signal and a quadrature portion Q. Under an ideal condition, a phase difference between the quadrature portion Q and the in-phase portion I is 90 degrees, i.e., the quadrature portion Q and the in-phase portion I form a pair of mutually-orthogonal signals. On top of that, the mutually-orthogonal signals are also balanced in amplitude, i.e., there is no amplitude mismatch in the mutually-orthogonal signals either.

In the transmitter 110 shown in FIG. 1, signals of the local oscillator 117 are mixed into mixers 116 and 136 to form a primary source of signal imbalance between the quadrature portion Q and the in-phase portion I, i.e. the so-called I/Q imbalance, while processing the quadrature portion Q and the in-phase portion I. The I/Q imbalance caused by signals of the local oscillator 117 sabotages the orthogonality and the amplitude balance between the quadrature portion Q and the in-phase portion I and causes interference between the quadrature portion Q and the in-phase portion I. Besides, in the receiver 120, the I/Q imbalance also occurs between the quadrature portion Q and the in-phase portion I because of signals of the local oscillator 127 mixed into the mixers 122 and 124, where the I/Q imbalance is irrelevant to frequency.

There is also a frequency-related I/Q imbalance between the transmitter 110 and the receiver 120, where the frequency-related I/Q imbalance is caused by mismatch between analog elements of the transmitter 110 and the receiver 120, and the analog elements may include low-pass filters, analog-to-digital converters, or digital-to-analog converters.

Please refer to FIG. 3, which schematically illustrates the I/Q imbalance occurring in the transmitter 110 shown in FIG. 1 and the receiver 120 shown in FIG. 2 in a frequency domain. As shown in FIG. 3, if frequencies of the signals outputted from the transmitter 110 are equal to a frequency $f_{RF1}=f_{Lo}+f_{m1}$ and a frequency $f_{RF2}=f_{Lo}+f_{m2}$, where the frequency $f_{Lo}$ is the frequency of the local oscillator, besides the signal portions $S_{m1}$ and $S_{m2}$ respectively having frequencies $f_{RF1}$ and $f_{RF2}$, image portions $I_{m1}$ and $I_{m2}$ respectively having frequencies $(f_{Lo}-f_{m1})$ and $(f_{Lo}-f_{m2})$ as shown in FIG. 3 are also generated because of the I/Q imbalance occurred between the quadrature portion and the in-phase portion in the transmitter 110 and the receiver 120. Besides, when the receiver 120 receives signals having a frequency $f_{RF1}=f_{Lo}+f_{m1}$ and a frequency $f_{RF2}=f_{Lo}+f_{m2}$ from the transmitter 110 via the antenna 128, since the I/Q imbalance is also introduced by the local oscillator 127, the receiver 120 generates four signals having different frequencies $f_{m1}$, $f_{m2}$, $-f_{m1}$, and $-f_{m2}$ in order, where signals having the frequencies $f_{m1}$ and $f_{m2}$ indicate the signal portion in the receiver, and the signals having the frequencies $-f_{m1}$ and $-f_{m2}$ indicate the image portion in the receiver 120. If the image portions $I_{m1}$ and $I_{m2}$ respectively having frequencies $(f_{Lo}-f_{m1})$ and $(f_{Lo}-f_{m2})$ can be filtered off, and if the image portions $I_{m1}'$ and $I_{m2}'$ respectively having frequencies $-f_m$ and $-f_{m2}$ can also be filtered off, i.e. if the orthogonality and amplitude balance between the quadrature portion and the in-phase portion of signals in the transmitter 110 and the receiver 120 can be kept without interfering each other, noises caused by the I/Q imbalance in the transmitter 110 and the receiver 120 can be neutralized.

SUMMARY OF THE INVENTION

The claimed invention discloses a method of compensating signal imbalance in a wireless communication system. The method comprises receiving N first single-tone signals and N second single-tone signals at a receiver of the wireless communication system, where frequencies of the N first single-tone signals are different, frequencies of the N second single-tone signals are different, each of the N first single-tone signals has a corresponding second single-tone signal from the N second single-tone signals, and a difference between a frequency of each first single-tone signal and a local oscillating frequency is equal to a difference between a frequency of each second single-tone signal and the local oscillating frequency; transforming the N first single-tone signals from a time domain to a frequency domain for generating a first signal coefficient and a first image coefficient for each of the N first single-tone signals; dividing a complex conjugate of the first signal coefficient of each the first single-tone signal by the first image coefficient of each said first single-tone signal to generate N first frequency-domain filter coefficients; transforming the N second single-tone signals from the time domain to the frequency domain for generating a second signal coefficient and a second image coefficient for each of the N second single-tone signals; dividing a complex conjugate of the second signal coefficient of each the second single-tone signal by the second image coefficient of each said second single-tone signal to generate N second frequency-domain filter coefficients; performing inverse Fast Fourier Transform (IFFT) on the N first frequency-domain filter coefficients and the N second frequency-domain filter coefficients to generate 2N time-domain filter coefficients; and utilizing the 2N time-domain filter coefficients to process complex conjugates of a plurality of wireless signals to generate a plurality of compensation signals, and adding the plurality of compensation signals and the plurality of wireless signals to generate a plurality of compensated signals.

The claimed invention further discloses a method of compensating signal imbalance of a transmitter of a wireless communication system. The method comprises inputting N first single-tone signals and N second single-tone signals to the transmitter of the wireless communication system, where frequencies of the N first single-tone signals are different, frequencies of the N second single-tone signals are different, each of the first single-tone signal has a corresponding second single-tone signal, and a sum of the first single-tone signal and its corresponding second single-tone signal is zero; inputting the N first single-tone signals and the N second single-tone signals into a passive mixer, for generating N first mixed signals corresponding to the N first single-tone signals and for generating N second mixed signals corresponding to the N second single-tone signals; determining a first quadrature frequency-domain filter coefficient and a first in-phase frequency domain filter coefficient according to a first signal minimal value of each the first mixed signal at a corresponding first frequency from a plurality of first frequency-domain frequencies, for generating N first frequency-domain filter coefficients, wherein each the first frequency-domain frequency is equal to double of a frequency of a corresponding first single-tone signal; determining a second quadrature frequency-domain filter coefficient and a second in-phase frequency domain filter coefficient according to a second signal minimal value of each the second mixed signal at a corresponding second frequency from a plurality of second frequency-domain frequencies, for generating N second frequency-domain filter coefficients, where each the second frequency-domain frequency is equal to double of a frequency of a corresponding second single-tone signal; performing IFFT on the N first frequency-domain filter coefficients and the N second frequency-domain filter coefficients to generate 2N time-domain filter coefficients; and utilizing the 2N time-domain filter coefficients to process complex conjugates of a plurality of wireless signals to generate a plurality of compensation signals, and adding the plurality of compensation signals and the plurality of wireless signals to generate a plurality of compensated signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 illustrates a schematic diagram of illustrating a condition that an image portion $I_m$ at a frequency-domain frequency $-f_m$ is compensated by compensations signals and that a signal portion $S_m$ at a frequency-domain frequency $f_m$ is preserved after performing the method shown in FIG. 5.

DETAILED DESCRIPTION

For neutralizing the abovementioned signal imbalance called I/Q imbalance, the present invention discloses a method of compensating the I/Q imbalance in the transmitter and another method of compensating the I/Q imbalance in the receiver. Primary characteristics of the method of compensating the I/Q imbalance includes inputting single-tone signals into the transmitter or the receiver for testing so as to determine a set of time-domain filter coefficients for compensating the I/Q imbalance, and includes utilizing the set of determined time-domain filter coefficients in the filter for processing various types of wireless signals including at least single-tone signals inputted at the transmitter or the receiver for neutralizing the I/Q imbalance between the quadrature portion and the in-phase portion of the inputted various types of wireless signals.

Figure 1:
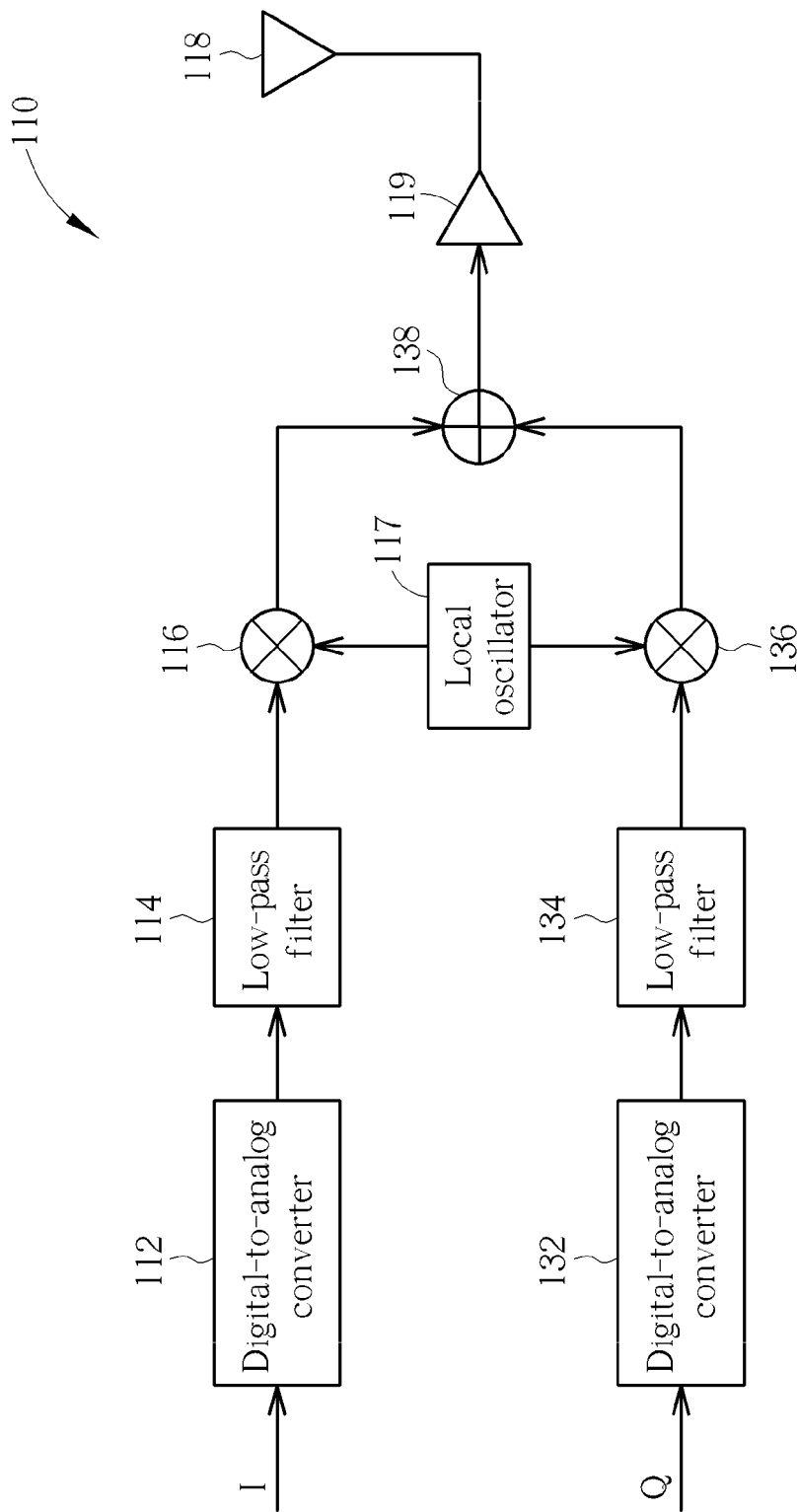
FIG. 1 and FIG. 2 illustrate a transmitter and a receiver of a conventional communication system.
Figure 2:
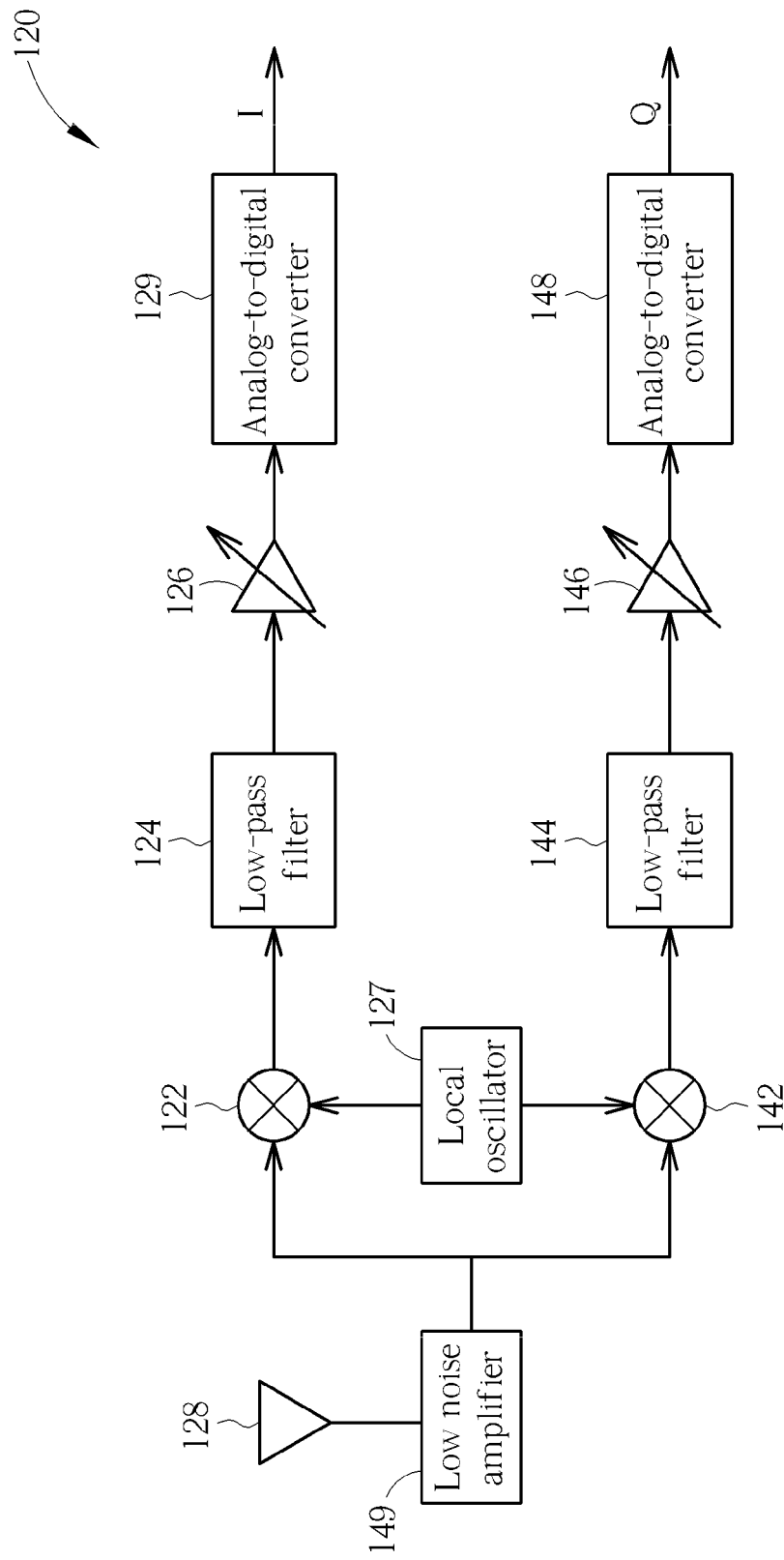
Figure 3:
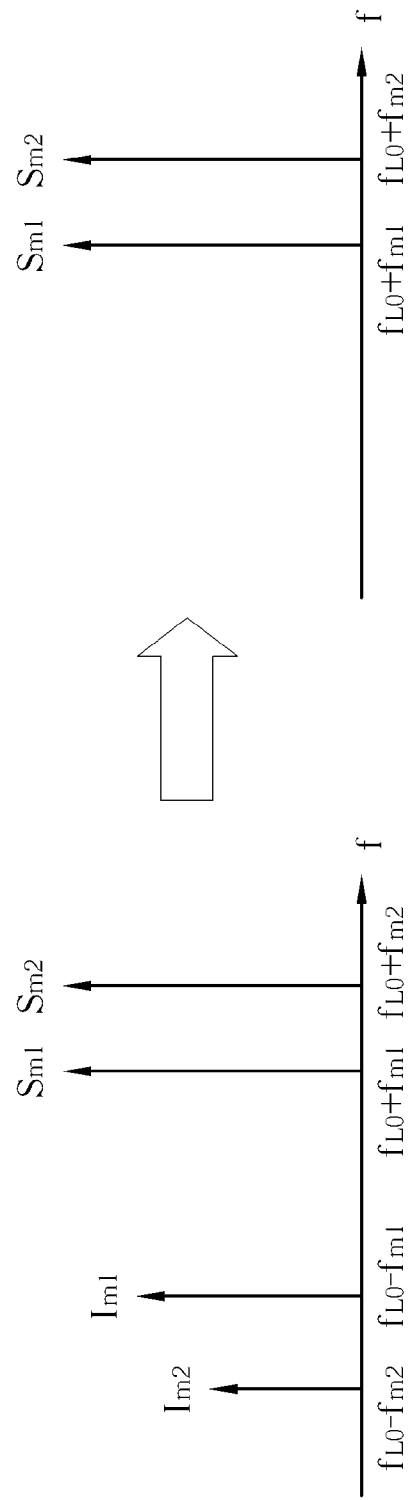
FIG. 3 schematically illustrates I/Q imbalance occurring in the transmitter shown in FIG. 1 and the receiver shown in FIG. 2 in a frequency domain.
Figure 4:
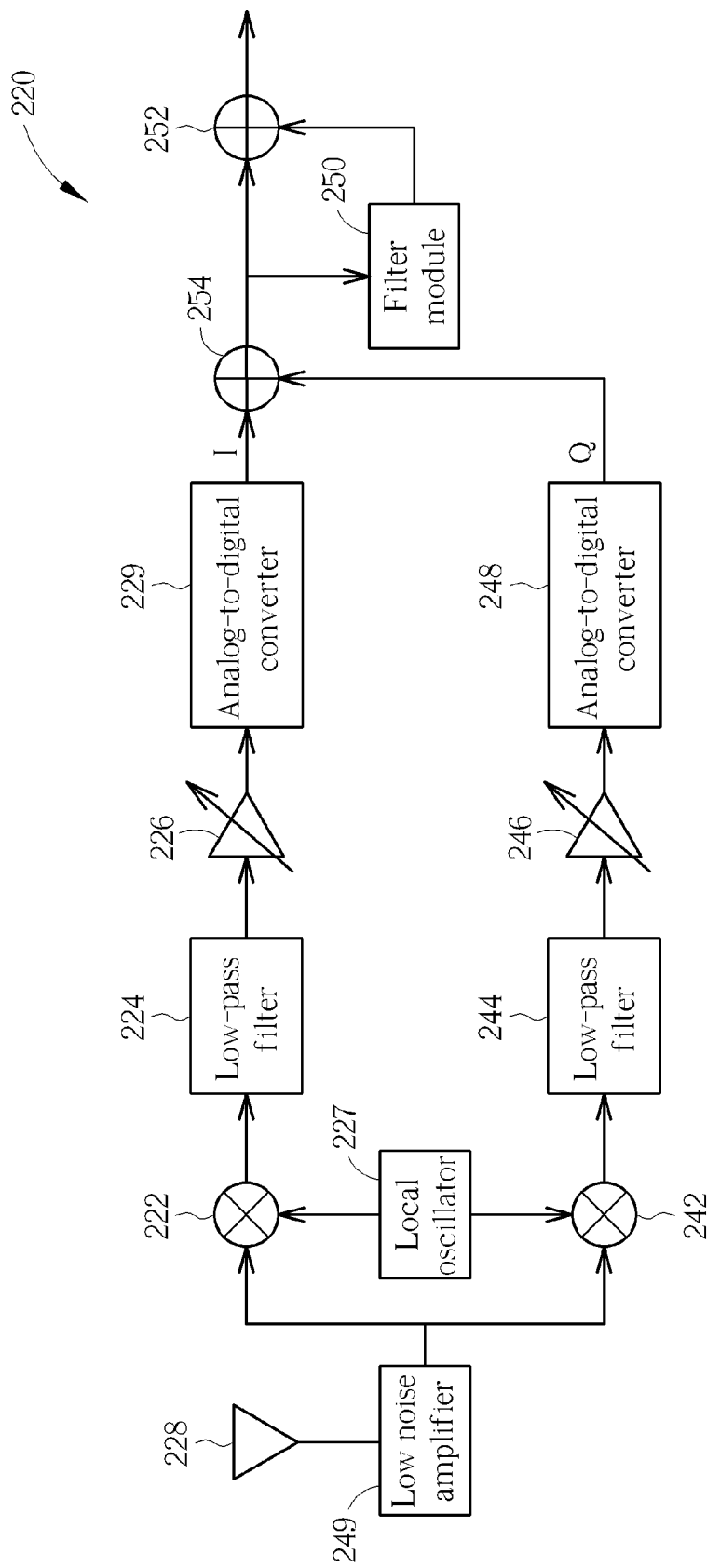
FIG. 4 illustrates a schematic diagram of a receiver for applying the method of compensating the I/Q imbalance according to one embodiment of the present invention.

Please refer to FIG. 4, which illustrates a schematic diagram of a receiver 220 for applying the method of compensating the I/Q imbalance according to one embodiment of the present invention. As shown in FIG. 4, the receiver 220 includes an antenna 228, a low-noise amplifier 249, mixers 222 and 242, a local oscillator 227, low-pass filters 224 and 244, gain controllers 226 and 246, analog-to-digital converter 229 and 248, adders 252 and 254, and a filter module 250. While applying the method of the present invention, a single-tone signal is inputted for testing so as to adjust a set of filter coefficients utilized by the filter module 250. The filter module 250 utilizes the set of filter coefficients to process complex conjugate signals of succeeding wireless signals of various types for generating compensation signals, and adds the compensation signals and the succeeding wireless signals at the adder 252 to neutralize the I/Q imbalance in the succeeding wireless signals.

Figure 5:
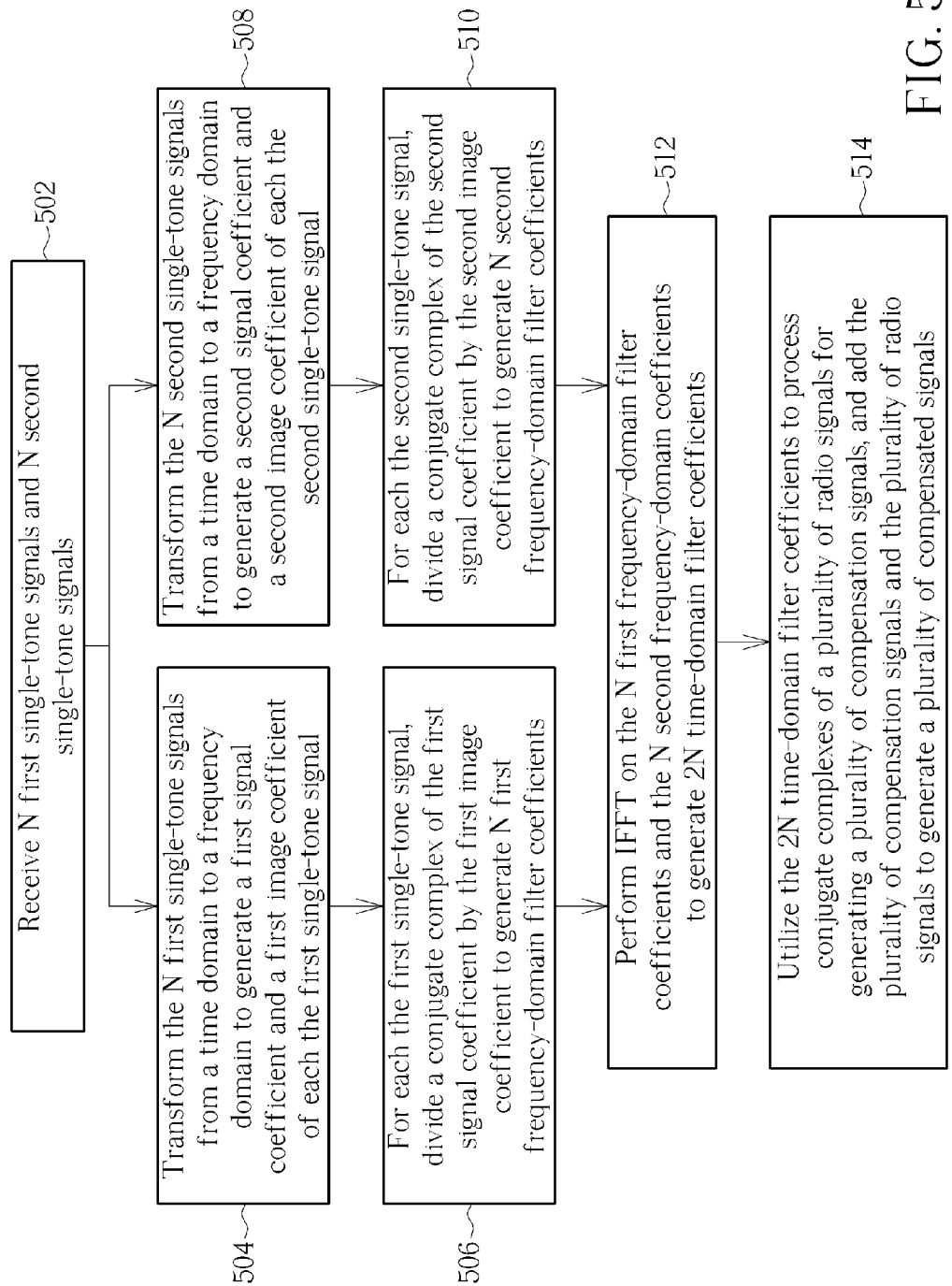
FIG. 5 illustrates a flowchart of generating compensation signals by generating filter coefficients in the receiver of the wireless communication system according to one embodiment of the present invention.

Please refer to FIG. 5, which illustrates a flowchart of generating compensation signals by generating filter coefficients in the receiver of the wireless communication system according to one embodiment of the present invention, where the filter module 250 is configured to generate the set of filter coefficients using the method shown in FIG. 5. As shown in FIG. 5, the method includes the following steps:

Step 502: Receive N first single-tone signals and N second single-tone signals at the receiver 220, where frequencies of the N first single-tone signals are different, frequencies of the N second single-tone signals are different, each the first single-tone signals has one corresponding second single-tone signal from N second single-tone signals, and a difference between a frequency of the first single-tone signal and a local oscillating frequency is equal to a difference of the local oscillating frequency and a frequency of a corresponding second single-tone signal;

Step 504: Transform the N first single-tone signals from a time domain to a frequency domain to generate a first signal coefficient and a first image coefficient of each the first single-tone signal.

Step 506: For each the first single-tone signal, divide a complex conjugate of the first signal coefficient by the first image coefficient to generate N first frequency-domain filter coefficients.

Step 508: Transform the N second single-tone signals from a time domain to a frequency domain to generate a second signal coefficient and a second image coefficient of each the second single-tone signal.

Step 510: For each the second single-tone signal, divide a complex conjugate of the second signal coefficient by the second image coefficient to generate N second frequency-domain filter coefficients.

Step 512: Perform inverse Fast Fourier Transform (IFFT) on the N first frequency-domain filter coefficients and the N second frequency-domain coefficients to generate 2N time-domain filter coefficients.

Step 514: Utilize the 2N time-domain filter coefficients to process complex conjugates of a plurality of wireless signals for generating a plurality of compensation signals, and add the plurality of compensation signals and the plurality of wireless signals to generate a plurality of compensated signals.

The method shown in FIG. 5 is explained in the following descriptions. In Step 502, the receiver 220 is configured to receive N first single-tone signals and N second single-tone signals outputted by the transmitter in a wireless manner, where N is a positive integer. The N first single-tone signals and the N second single-tone signals are inputted for test, and can be replaced by other types of wireless signals in succeeding practical usages. Frequencies of the N first single-tone signals are $(f_{LO}+f_{m1})$, $(f_{LO}+f_{m2})$, $(f_{LO}+f_{m3})$, ..., $(f_{LO}+f_{mN})$, and frequencies of the N second single-tone signals are $(f_{LO}-f_{m1})$, $(f_{LO}-f_{m2})$, $(f_{LO}-f_{m3})$, ..., $(f_{LO}-f_{mN})$ where $f_{LO}$ indicates a local oscillating frequency, and frequencies $f_{m1}$, $f_{m2}$, $f_{m3}$, ..., $f_{mN}$ are different. The N first single-tone signals are corresponding to the N second single-tone signals in a one-by-one manner, for example, a first single-tone signal having the frequency $(f_{LO}+f_{mi})$ is corresponding to a second single-tone frequency having the frequency $(f_{LO}-f_{m1})$.

In Step 504 and Step 508, the N first single-tone signals and the N second single-tone signals are transformed from the time domain to the frequency domain, for determining signal coefficients and image coefficients corresponding to the N first single-tone signals and the N second single-tone signals. In the succeeding process in the frequency domain, frequencies of the N first single-tone signals are regarded as frequency-domain frequencies $f_{m1}$, $f_{m2}$, $f_{m3}$, ..., $f_{mN}$, and frequencies of the N second single-tone signals are regarded as frequency-domain frequencies $-f_{m1}$, $-f_{m2}$, $-f_{m3}$, ..., $-f_{mN}$.

In Step 506 and Step 510, the complex conjugates of the signal coefficients of the N first single-tone signals are divided by the image coefficients of said N first single-tone signals respectively for generating N first frequency-domain filter coefficients $W_1$, $W_2$, $W_3$, ..., $W_N$; and the complex conjugates of the signal coefficients of the N second single-tone signals are divided by the image coefficients of said N second single-tone signals respectively for generating N second frequency-domain filter coefficients $W_{-1}$, $W_{-2}$, $W_{-3}$, ..., $W_N$.

In Step 512, the IFFT is performed on the N first frequency-domain filter coefficients $W_1$, $W_2$, $W_3$, ..., $W_N$ and the N second frequency-domain filter coefficients $W_{-1}$, $W_{-2}$, $W_{-3}$, ..., $W_{-N}$ for transforming from the frequency domain to the time domain to determine 2N time-domain filter coefficients.

In Step 514, the filter module 250 utilizes the 2N time-domain filter coefficients to process complex conjugates of a plurality of succeeding wireless signals including single-tone signals, so that the filter module 250 is capable of generating a plurality of compensation accordingly, where the filter module 250 may further include a complex conjugate module for generating the complex conjugates of the plurality of wireless signals. The adder 252 is configured to add the plurality of compensation signals and the plurality of wireless signals for neutralizing the I/Q imbalance introduced from orthogonality mismatch and amplitude mismatch between the quadrature portion and the in-phase portion of the wireless signals, and for generating a plurality of compensated signals to be output signals of the receiver 220.

In the steps shown in FIG. 5, the image coefficients at the frequency $-f_{m1}$ or $-f_{m2}$ are eliminated by the abovementioned compensation signals, and the signal coefficients are preserved, so that the interference between the quadrature portion and the in-phase portion of the wireless signals is prevented, and that the I/Q imbalance of the wireless signals is thus neutralized. Please refer to FIG. 6, which illustrates a schematic diagram of illustrating a condition that the image portion $I_m$ at the frequency-domain frequency $-f_m$ is compensated by compensations signals and that the signal portion $S_m$ at the frequency-domain frequency $f_m$ is preserved after performing the method shown in FIG. 5.

Figure 7:
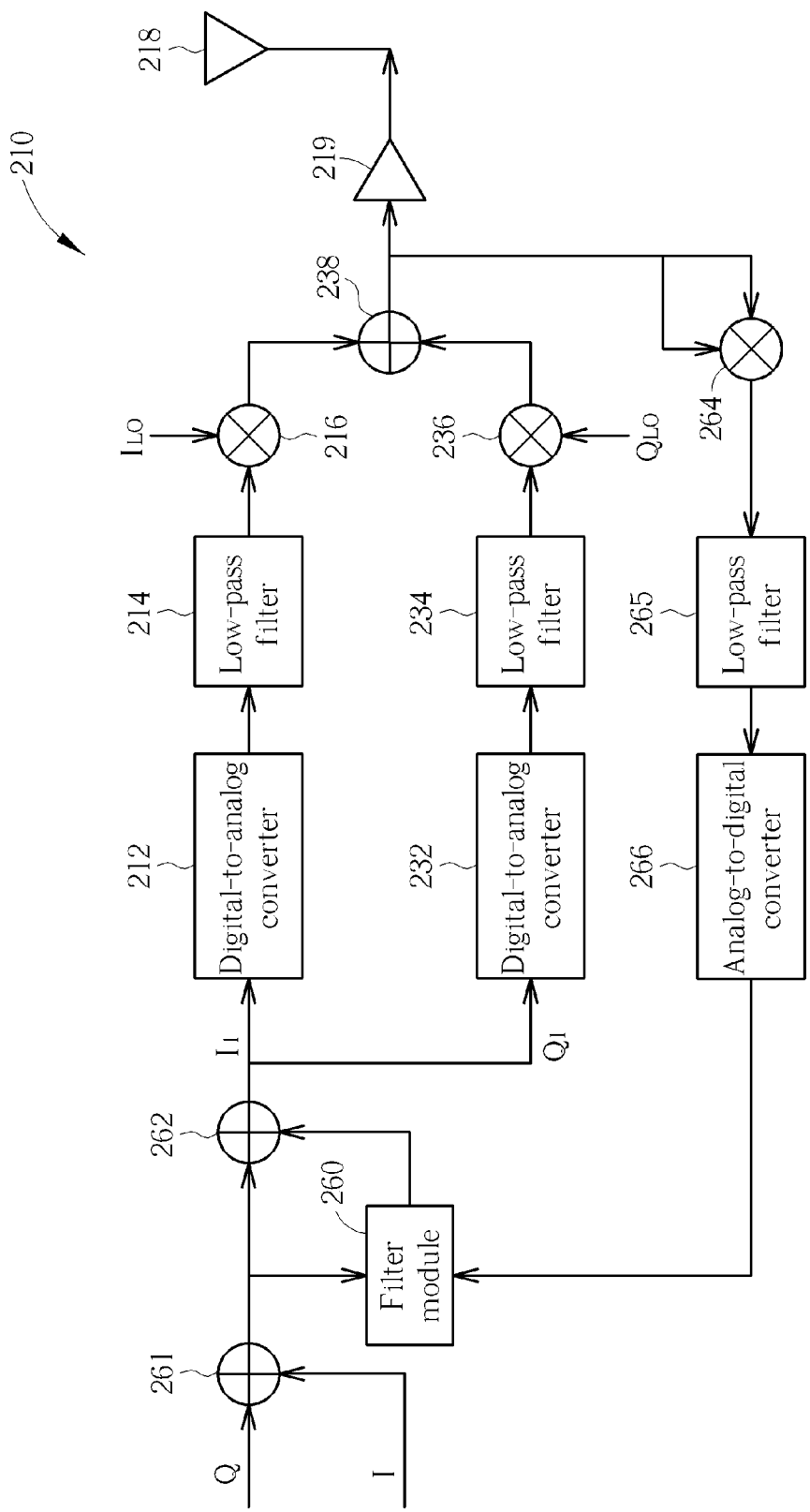
FIG. 7 illustrates a schematic diagram of a transmitter for implementing the method of compensating the I/Q imbalance according to one embodiment of the present invention.

Please refer to FIG. 7, which illustrates a schematic diagram of a transmitter 210 for implementing the method of compensating the I/Q imbalance according to one embodiment of the present invention, where single-tone signals are inputted to the transmitter 210 for testing to generate a set of corresponding filter coefficients and to neutralize the I/Q imbalance in succeeding wireless signals using the set of corresponding filter coefficients. As shown in FIG. 7, the transmitter 210 includes adders 261, 262 and 238, a filter module 260, digital-to-analog converters 212 and 232, low-pass filters 214, 234 and 265, a power amplifier 219, an antenna 218, and an analog-to-digital converter 266. The filter module 260 is configured to determine a set of filter coefficients according to the quadrature portion Q and the in-phase portion I in a single-ton signal and according to a digital signal returned from the analog-to-digital signal in a feedback manner during testing. Therefore, before the succeeding wireless signals are inputted into the transmitter 210, the I/Q imbalance introduced by orthogonality mismatch and amplitude mismatch between the in-phase portion and the quadrature portion of signals on the mixers 216 and 236 can be compensated, where the orthogonality mismatch and the amplitude mismatch on the mixers 216 and 236 primarily comes from signals of the local oscillator. The mixer 264 may be regarded as a passive mixer.

In FIG. 7, an in-phase portion $I_1$ of a compensated signal is transmitted to the digital-to-analog converter 212, and a quadrature portion of the compensated signal $Q_1$ is transmitted to the digital-to-analog converter 232. A signal $I_{LO}$ inputted to the mixer 216 indicates an in-phase portion of a local oscillator signal, and the signal $Q_{LO}$ inputted to the mixer 236 indicates a quadrature portion of the local oscillator signal.

Figure 8:
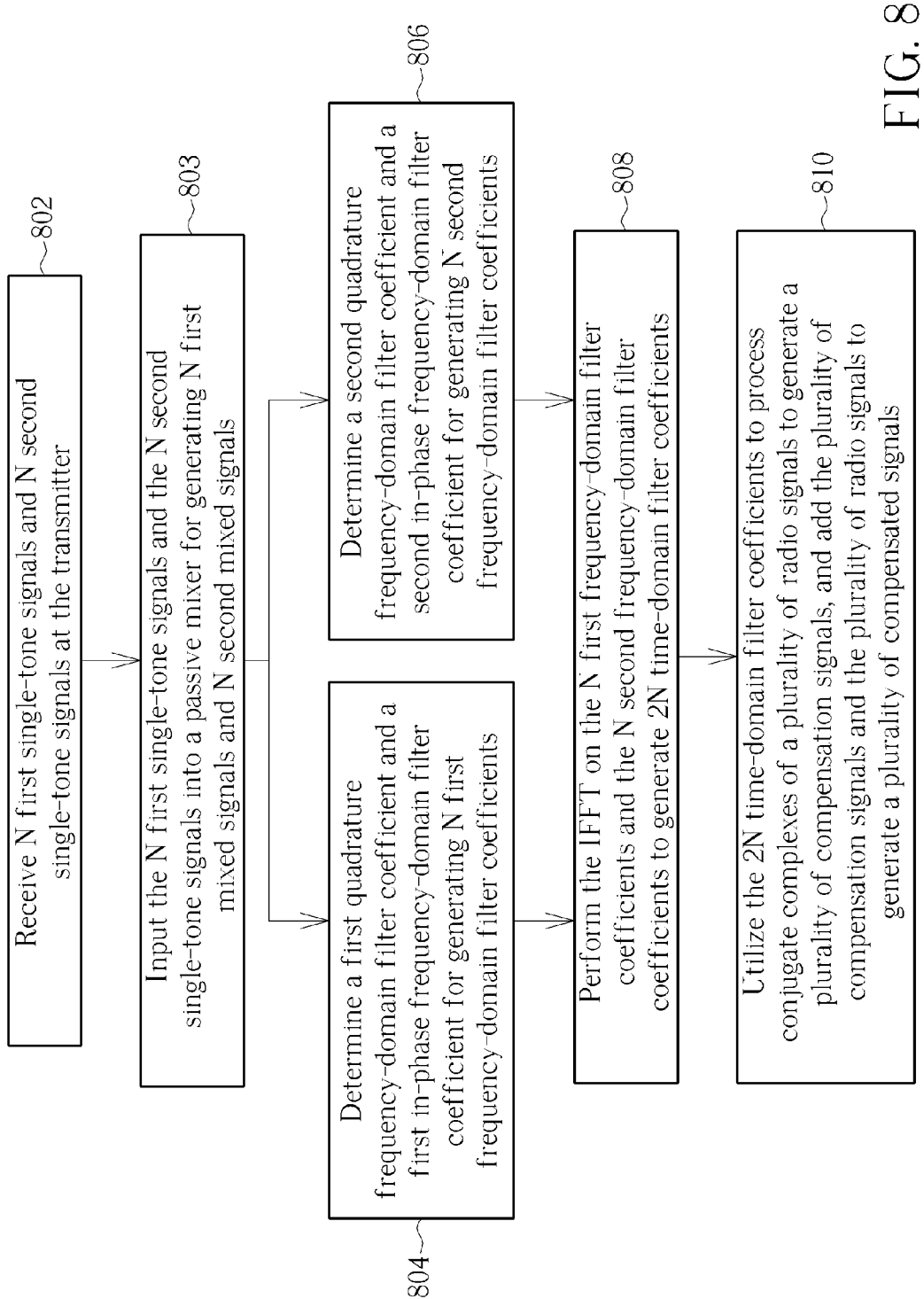
FIG. 8 illustrates a flowchart of generating filter coefficients in the transmitter of the wireless communication system according to one embodiment of the present invention.

Please refer to FIG. 8, which illustrates a flowchart of generating filter coefficients in the transmitter of the wireless communication system according to one embodiment of the present invention. As shown in FIG. 8, the method includes the following steps:

Step 802: Receive N first single-tone signals and N second single-tone signals at the transmitter 210, where frequencies of the N first single-tone signals are different, frequencies of the N second single-tone signals are different, each the first single-tone signal has a corresponding second single-tone signal from the N second single-tone signals, and a difference between a frequency of each the first single-tone signal and a local oscillating frequency is equal to a difference between the local oscillating frequency and a frequency of the corresponding second single-tone frequency.

Step 803: Input the N first single-tone signals and the N second single-tone signals into a passive mixer for generating N first mixed signals corresponding to the N first single-tone signals and for generating N second mixed signals corresponding to the N second single-tone signals.

Step 804: Determine a first quadrature frequency-domain filter coefficient and a first in-phase frequency-domain filter coefficient according to a first signal minimal value of each the first mixed signal corresponding to one of a plurality of first frequency-domain frequencies, for generating N first frequency-domain filter coefficients, where each the first frequency-domain frequency is equal to double of the frequency of each the first single-tone signal.

Step 806: Determine a second quadrature frequency-domain filter coefficient and a second in-phase frequency-domain filter coefficient according to a second signal minimal value of each the second mixed signal corresponding to one of a plurality of second frequency-domain frequencies, for generating N second frequency-domain filter coefficients, where each the second frequency-domain frequency is equal to double of the frequency of each the second single-tone signal.

Step 808: Perform the IFFT on the N first frequency-domain filter coefficients and the N second frequency-domain filter coefficients to generate 2N time-domain filter coefficients.

Step 810: Utilize the 2N time-domain filter coefficients to process complex conjugates of a plurality of wireless signals to generate a plurality of compensation signals, and add the plurality of compensation signals and the plurality of wireless signals to generate a plurality of compensated signals.

Steps shown in FIG. 8 are explained via the following examples. In Step 802, the transmitter 210 is configured to receive N first single-tone signals and N second single-tone signals, where frequencies of the N first single-tone signals are $f_{m1}, f_{m2}, f_{m3}, \ldots, f_{mN}$, and frequencies of the N second single-tone signals are $-f_{m1}, -f_{m2}, -f_{m3}, \ldots, -f_{mN}$. The N first single-tone signals and the N second single-tone signals are inputted to the transmitter 210 for testing, and can be replaced by other types of wireless signals in succeeding practical usages.

In Step 803, the N first single-tone signals and the N second single-tone signals are processed by the passive mixer 264 to generate N first mixed signals corresponding to the N first single-tone signals and to generate N second mixed signals corresponding to the N second single-tone signals. The N first mixed signals are located at a feedback loop of the N first single-tone signals respectively, where the feedback loop includes at least the passive mixer 264 and the low-pass filter 265 so that signal magnitudes of the N first mixed signal in the frequency domain can be detected. Similarly, the N second mixed signals are located at a feedback loop of the N second single-tone signals respectively.

In Step 804 and Step 806, the filter module 260 is configured to detect a frequency-domain portion of the N first mixed signals on the feedback loop formed by the passive mixer 264, the low-pass filter 265, and the analog-to-digital converter 266, for determining N first frequency-domain filter coefficients $WW_1, WW_2, WW_3, \ldots, WW_N$; similarly, the filter module 260 is also configured to determining N second frequency-domain filter coefficients $WW_{-1}, WW_{-2}, WW_{-3}, \ldots, WW_{-N}$ in a same way. The N first frequency-domain filter coefficients $WW_1, WW_2, WW_3, \ldots, WW_N$ are determined under a condition that a signal minimal value occurs at a double of a corresponding first frequency-domain frequency for the N first mixed signals, i.e., at the frequency $2f_m$. Similarly, The N second frequency-domain filter coefficients $WW_{-1}, WW_{-2}, WW_{-3}, \ldots, WW_{-N}$ are determined under a condition that a signal minimal value occurs at a double of a corresponding second frequency-domain frequency for the N second mixed signals, i.e., at the frequency $-2f_m$.

Take practical usages for example. While determining the first frequency-domain filter coefficients $WW_1$ corresponding to the first single-tone signal at the frequency $f_{m1}$, the first frequency-domain filter coefficients $WW1$ must match the condition that a signal minimal value of the first mixed signal occurs at the frequency $2f_{m1}$; similarly, while determining the second frequency-domain filter coefficients $WW_{-1}$ corresponding to the second single-tone signal at the frequency $-f_{m1}$, the second frequency-domain filter coefficients $WW_{-1}$ must match the condition that a signal minimal value of the second mixed signal occurs at the frequency $-2f_{m1}$. How to determine the signal minimal value is to be disclosed in FIG. 9.

In Step 808, the filter module 260 is configured to perform the IFFT on the N first frequency-domain filter coefficients $WW_1, WW_2, WW_3, \ldots, WW_N$ and the N second frequency-domain filter coefficients $WW_{-1}, WW_{-2}, WW_{-3}, \ldots, WW_{-N}$, for generating 2N time-domain filter coefficients. In Step 810, the filter module 260 is configured to the 2N time-domain filter coefficients to process the complex conjugates of the succeeding plurality of wireless signals for generating a plurality of compensation signals, so that the plurality of compensation signals are added with the plurality of wireless signals at the adder 262 to neutralize the I/Q imbalance introduced by orthogonality mismatch and amplitude mismatch between the in-phase portion and the quadrature portion of the plurality of wireless signals.

Figure 9:
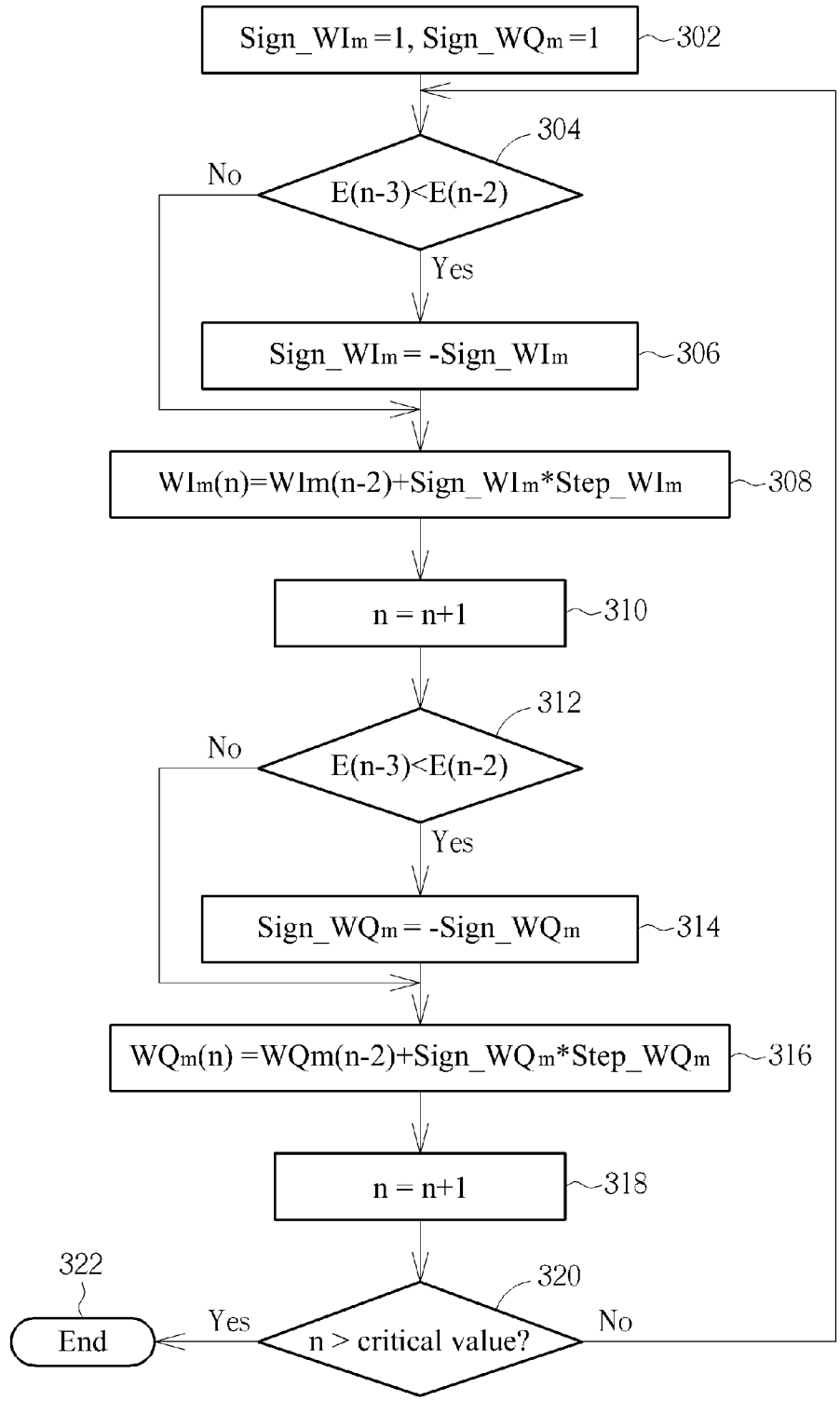
FIG. 9 illustrates a flowchart of determining the N first frequency-domain filter coefficients and the N second frequency-domain filter coefficients in Step 804 and Step 806 shown in FIG. 8 according to one embodiment of the present invention.

Please refer to FIG. 9, which illustrates a flowchart of determining the N first frequency-domain filter coefficients $WW_1, WW_2, WW_3, \ldots, WW_N$ and the N second frequency-domain filter coefficients $WW_{-1}, WW_{-2}, WW_{-3}, \ldots, WW_{-N}$ in Step 804 and Step 806 shown in FIG. 8 according to one embodiment of the present invention. The primary techniques shown in FIG. 9 includes adjusting a plurality of taps of each the mixed signal in a stepwise manner so that the plurality of taps are adjusted in a trend that a corresponding mixed signal has a gradually-reduced signal magnitude at the frequency-domain frequency $2f_m$ or $-2f_m$. Therefore, the plurality of taps of a mixed signal can be adjusted for rendering their corresponding mixed signal has a smallest signal magnitude at the frequency-domain frequency $2f_m$ or $-2f_m$ at last, so that a quadrature portion of the corresponding mixed signal is determined to be a quadrature frequency-domain filter coefficient to be utilized for a corresponding single-tone signal, and that an in-phase portion of the corresponding mixed signal is determined to be an in-phase frequency-domain filter coefficient to be utilized for the corresponding single-tone signal. By combining the quadrature frequency-domain filter coefficient with the in-phase frequency-domain filter coefficient in a complex form, the first frequency-domain filter coefficient mentioned in Step 804 or the second frequency-domain filter coefficient mentioned in Step 806 is generated.

During the abovementioned stepwise adjustment, a step sign Sign_WQm corresponding to the quadrature portion and a step sign Sign_WIm corresponding to the in-phase portion are gradually adjusted, where both the step signs Sign_WQm and Sign_WIm are corresponding to a single-tone signal or a wireless signal having a frequency-domain frequency $f_m$. A first signed step is generated by multiplying the step sign Sign_WQm with a step quadrature value Step_WQm, and a second signed step is generated by multiplying the step sign Sign_WIm with a step in-phase value Step_WIm. Each time when a new tap is adjusted, the new tap is adjusted by adding a previous tap to the first signed step for the quadrature portion or to the second signed step for the in-phase portion.

As shown in FIG. 9, the flowchart of determining the N first frequency-domain filter coefficients $WW_1, WW_2, WW_3, \ldots, WW_N$ and the N second frequency-domain filter coefficients $WW_{-1}, WW_{-2}, WW_{-3}, \ldots, WW_{-N}$ includes the following steps:

Step 302: Set default values of the step signs Sign_WQm and Sign_WIm to be 1, i.e., a positive sign.

Step 304: Compare a signal magnitude E(n−3) of a front tap of two consecutive taps of the single-tone signal with a signal magnitude E(n−2) of a rear tap of the two consecutive taps of said single-tone signal at the frequency-domain frequency $2f_m$. When the signal magnitude E(n−3) is lower than the signal magnitude E(n−2), go to Step 306; else, when the signal magnitude E(n−3) is not lower than the signal magnitude E(n−2), go to Step 308.

Step 306: Change a value of the step sign Sign_WIm.

Step 308: Generate a new tap by adding an in-phase frequency-domain filter coefficient WIm(n−2) corresponding to the rear tap to a product of the step sign Sign_WIm and the step in-phase value Step_WIm, where the new tap is corresponding to an in-phase frequency-domain filter coefficient WIm(n).

Step 310: Increment a value of the variable n.

Step 312: Compare a signal magnitude E(n−3) of the front tap of the two consecutive taps of the single-tone signal with the signal magnitude E(n−2) of the rear tap of the two consecutive taps of said single-tone signal at the frequency-domain frequency $2f_m$. When the signal magnitude E(n−3) is lower than the signal magnitude E(n−2), go to Step 314; else, when the signal magnitude E(n−3) is not lower than the signal magnitude E(n−2), go to Step 316.

Step 314: Change a value of the step sign Sign_QIm.

Step 316: Generate a new tap by adding a quadrature frequency-domain filter coefficient WQm(n−2) corresponding to the rear tap to a product of the step sign Sign_WQm and the step quadrature value Step_WQm, where the new tap is corresponding to a quadrature frequency-domain filter coefficient WQm(n).

Step 318: Increment the value of the variable n.

Step 320: Determine whether the value of the variable n is larger than a critical value. When the value of the variable n is larger than the critical value, go to Step 322; else, go to Step 304.

Step 322: End.

Steps shown in FIG. 9 are explained in the following descriptions. Step 304, Step 306, and Step 308 are related to a process of stepwise adjusting the in-phase frequency-domain filter coefficient WIm; Step 312, Step 314, and Step 316 are related to a process of stepwise adjusting the quadrature frequency-domain filter coefficient WQm. In another embodiment of the present invention, a group including Step 304, Step 306, and Step 308 can be exchanged with another group including Step 312, Step 314, and Step 316 in FIG. 9, so that the quadrature frequency-domain filter coefficient WQm can be adjusted prior to the in-phase frequency-domain filter coefficient WIm.

The value of the step signs Sign_WQm and Sign_WIm may be 1 or −1. When the value of the step sign Sign_WQm or Sign_WIm is 1, it indicates a gradually-increasing trend of stepwise adjusting the in-phase frequency-domain filter coefficient WIm or the quadrature frequency-domain filter coefficient WQm; else, when the value of the step sign Sign_WQm or Sign_WIm is −1, it indicates a gradually-decreasing trend of stepwise adjusting the in-phase frequency-domain filter coefficient WIm or the quadrature frequency-domain filter coefficient WQm. Therefore, in Step 302, default values of the value of the step signs Sign_WQm and Sign_WIm are 1, that is, a default trend of stepwise adjusting the in-phase frequency-domain filter coefficient WIm and the quadrature frequency-domain filter coefficient WQm is gradually-increasing. However, in other embodiments of the present invention, the default values of the step signs Sign_WQm and Sign_WIm may be an arbitrary combination of values 1 and/or −1 and not be limited to the default values mentioned in Step 302.

In Step 304 and Step 312, signal magnitudes E(n−3) and E(n−2) of two consecutive taps of a mixed signal at a frequency-domain frequency $2f_m$ or $-2f_m$ are compared. The signal magnitudes E(n−3) and E(n−2) indicate a degree of orthogonality mismatch and amplitude mismatch between the quadrature portion and the in-phase portion of a corresponding single-tone signal. Since the mixed signal received by the filter module 250 has been processed by the analog-to-digital converter 266, signal magnitudes of each frequency-domain frequency of the mixed signal can be directly detected by the filter module 260, so as to perform the comparisons mentioned in Step 304 and Step 312 for confirming the degree of the orthogonality mismatch and the amplitude mismatch.

In Step 304 or Step 312, when the signal magnitude E(n−3) is smaller than the signal magnitude E(n−2), it indicates that the in-phase frequency-domain filter coefficient WIm or the quadrature frequency-domain filter coefficient WQm is generated in a trend that enhances the orthogonality mismatch and amplitude mismatch between the in-phase portion and the quadrature portion of the corresponding single-tone signal, therefore, as mentioned in Step 306 or Step 314, the step sign is required to be changed for attenuating the orthogonality mismatch and amplitude mismatch, i.e. attenuating the abovementioned signal magnitude. In Step 304 or Step 312, if the signal magnitude E(n−3) is not smaller than the signal magnitude E(n−2), it indicates that the in-phase frequency-domain filter coefficient WIm or the quadrature frequency-domain filter coefficient WQm is generated in a trend that attenuates the orthogonality mismatch and amplitude mismatch between the in-phase portion and the quadrature portion of the corresponding single-tone signal, so that no change is required for the step sign currently for changing the trend.

Therefore, in Step 308 or Step 316, the rear tap indicating a later timing can be determined according to the front tap having an earlier timing, and the in-phase frequency-domain filter coefficient WIm or the quadrature frequency-domain filter coefficient WQm capable of attenuating the abovementioned orthogonality mismatch and amplitude mismatch are gradually adjusted and determined. The purpose of Step 310 and Step 318 is to render the stepwise adjustment to be performed in an iterative manner. The purpose of Step 320 is to ensure that the stepwise adjustment to be ended within a predetermined time, which is determined according to the critical value mentioned in Step 320, and the critical value can be updated according to execution time requirements of the stepwise adjustment.

While reaching Step 322, the in-phase frequency-domain filter coefficient WIm or the quadrature frequency-domain filter coefficient WQm capable of attenuating the abovementioned orthogonality mismatch and amplitude mismatch to a lowest degree usually occurs at a last tap, e.g. the n-th tap, or a front-neighboring tap of the last tap, e.g. the (n−1)-th tap, so that an ideal first frequency-domain filter coefficient and an ideal second frequency-domain filter coefficient can thus be found in Step 804 and Step 806; at last, the IFFT is performed on the N first frequency-domain filter coefficients and the N second frequency-domain filter coefficients for generating the 2N time-domain filter coefficients to neutralize the I/Q imbalance introduced in single-tone signals for testing or in wireless signals for practical usage.

The present invention discloses a method of compensating noises caused from I/Q imbalance in a transmitter and a receiver of a wireless communication system, for preventing wireless signals from being affected by orthogonality mismatch and amplitude mismatch between quadrature portion and in-phase portion of the wireless signals caused by mismatch of local oscillators or analog elements in the wireless communication system.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of compensating signal imbalance in a wireless communication system, comprising:
   receiving N first single-tone signals and N second single-tone signals at a receiver of the wireless communication system, wherein frequencies of the N first single-tone signals are different, frequencies of the N second single-tone signals are different, each of the N first single-tone signals has a corresponding second single-tone signal from the N second single-tone signals, and a difference between a frequency of each first single-tone signal and a local oscillating frequency is equal to a difference between a frequency of each second single-tone signal and the local oscillating frequency;
   transforming the N first single-tone signals from a time domain to a frequency domain for generating a first signal coefficient and a first image coefficient for each of the N first single-tone signals;
   dividing a complex conjugate of the first signal coefficient of each the first single-tone signal by the first image coefficient of each said first single-tone signal to generate N first frequency-domain filter coefficients;
   transforming the N second single-tone signals from the time domain to the frequency domain for generating a second signal coefficient and a second image coefficient for each of the N second single-tone signals;
   dividing a complex conjugate of the second signal coefficient of each the second single-tone signal by the second image coefficient of each said second single-tone signal to generate N second frequency-domain filter coefficients;
   performing inverse Fast Fourier Transform (IFFT) on the N first frequency-domain filter coefficients and the N second frequency-domain filter coefficients to generate 2N time-domain filter coefficients; and
   utilizing the 2N time-domain filter coefficients to process complex conjugates of a plurality of wireless signals to generate a plurality of compensation signals, and adding the plurality of compensation signals and the plurality of wireless signals to generate a plurality of compensated signals.

2. The method of claim 1, further comprising:
   outputting the N first single-tone signals and the N second single-tone signals to the receiver.

3. A method of compensating signal imbalance of a transmitter of a wireless communication system, comprising:
   inputting N first single-tone signals and N second single-tone signals to the transmitter of the wireless communication system, wherein frequencies of the N first single-tone signals are different, frequencies of the N second single-tone signals are different, each of the first single-tone signal has a corresponding second single-tone signal, and a sum of the first single-tone signal and its corresponding second single-tone signal is zero;
   inputting the N first single-tone signals and the N second single-tone signals into a passive mixer, for generating N first mixed signals corresponding to the N first single-tone signals and for generating N second mixed signals corresponding to the N second single-tone signals;
   determining a first quadrature frequency-domain filter coefficient and a first in-phase frequency domain filter coefficient according to a first signal minimal value of each the first mixed signal at a corresponding first frequency from a plurality of first frequency-domain frequencies, for generating N first frequency-domain filter coefficients, wherein each the first frequency-domain frequency is equal to double of a frequency of a corresponding first single-tone signal;
   determining a second quadrature frequency-domain filter coefficient and a second in-phase frequency domain filter coefficient according to a second signal minimal value of each the second mixed signal at a corresponding second frequency from a plurality of second frequency-domain frequencies, for generating N second frequency-domain filter coefficients, wherein each the second frequency-domain frequency is equal to double of a frequency of a corresponding second single-tone signal;
   performing IFFT on the N first frequency-domain filter coefficients and the N second frequency-domain filter coefficients to generate 2N time-domain filter coefficients; and
   utilizing the 2N time-domain filter coefficients to process complex conjugates of a plurality of wireless signals to generate a plurality of compensation signals, and adding the plurality of compensation signals and the plurality of wireless signals to generate a plurality of compensated signals.

4. The method of claim 3, further comprising:
   determining a minimal value of each the first mixed signal at its corresponding first frequency-domain frequency to be the first signal minimal value; and
   determining a minimal value of each the second mixed signal at its corresponding second frequency-domain frequency to be the second signal minimal value.

5. The method of claim 4, wherein determining the minimal value of each the first mixed signal at its corresponding first frequency-domain frequency to be the first signal minimal value comprises:
   iteratively comparing signal values of two consecutive taps of each the first mixed signal at the corresponding first frequency-domain frequency, and determining the first signal minimal value according to a result of iteratively comparing the signal values of the two consecutive taps of each the first mixed signal at the corresponding first frequency-domain frequency; and
   wherein determining the minimal value of each the second mixed signal at its corresponding second frequency-domain frequency to be the second signal minimal value comprises:
   iteratively comparing signal values of two consecutive taps of each the second mixed signal at the corresponding second frequency-domain frequency, and determining the second signal minimal value according to a result of iteratively comparing the signal values of the two consecutive taps of each the second mixed signal at the corresponding second frequency-domain frequency.

6. The method of claim 5, wherein determining the first quadrature frequency-domain filter coefficient and the first in-phase frequency domain filter coefficient according to the first signal minimal value of each the first mixed signal at the corresponding first frequency from the plurality of first frequency-domain frequencies comprises:
   changing a signed step when a signal value at the corresponding first frequency-domain frequency of a front tap of the two consecutive taps is smaller than a signal value at the corresponding first frequency-domain frequency of a rear tap of the two consecutive taps; and
   adding the first quadrature frequency-domain filter coefficient or the first in-phase frequency-domain filter coefficient and the signed step, for updating the first quadrature frequency-domain filter coefficient or the first in-phase frequency-domain filter coefficient in a stepwise manner;

wherein the signed step is a stepwise-tuning value of the first quadrature frequency-domain filter coefficient or of the first in-phase frequency-domain filter coefficient.

7. The method of claim 5, wherein determining the first quadrature frequency-domain filter coefficient and the first in-phase frequency domain filter coefficient according to the first signal minimal value of each the first mixed signal at the corresponding first frequency from the plurality of first frequency-domain frequencies comprises:

adding the first quadrature frequency-domain filter coefficient or the first in-phase frequency-domain filter coefficient and a signed step when a signal value at the corresponding first frequency-domain frequency of a front tap of the two consecutive taps is not smaller than a signal value at the corresponding first frequency-domain frequency of a rear tap of the two consecutive taps, for updating the first quadrature frequency-domain filter coefficient or the first in-phase frequency-domain filter coefficient in a stepwise manner;

wherein the signed step is a stepwise-tuning value of the first quadrature frequency-domain filter coefficient or of the first in-phase frequency-domain filter coefficient.

8. The method of claim 5, wherein determining the second quadrature frequency-domain filter coefficient and the second in-phase frequency domain filter coefficient according to the second signal minimal value of each the second mixed signal at the corresponding second frequency from the plurality of second frequency-domain frequencies comprises:

changing a signed step when a signal value at the corresponding second frequency-domain frequency of a front tap of the two consecutive taps is smaller than a signal value at the corresponding second frequency-domain frequency of a rear tap of the two consecutive taps; and adding the second quadrature frequency-domain filter coefficient or the second in-phase frequency-domain filter coefficient and the signed step, for updating the second quadrature frequency-domain filter coefficient or the second in-phase frequency-domain filter coefficient in a stepwise manner;

wherein the signed step is a stepwise-tuning value of the second quadrature frequency-domain filter coefficient or of the second in-phase frequency-domain filter coefficient.

9. The method of claim 5, wherein determining the second quadrature frequency-domain filter coefficient and the second in-phase frequency domain filter coefficient according to the second signal minimal value of each the second mixed signal at the corresponding second frequency from the plurality of second frequency-domain frequencies comprises:

adding the second quadrature frequency-domain filter coefficient or the second in-phase frequency-domain filter coefficient and a signed step when a signal value at the corresponding second frequency-domain frequency of a front tap of the two consecutive taps is not smaller than a signal value at the corresponding second frequency-domain frequency of a rear tap of the two consecutive taps, for updating the second quadrature frequency-domain filter coefficient or the second in-phase frequency-domain filter coefficient in a stepwise manner;

wherein the signed step is a stepwise-tuning value of the second quadrature frequency-domain filter coefficient or of the second in-phase frequency-domain filter coefficient.

* * * * *